(12) United States Patent
Song (10) Patent No.: US 9,637,815 B2
(45) Date of Patent: May 2, 2017

(54) METHOD FOR FORMING FINE PATTERN, AND FINE PATTERN FORMED USING SAME

(71) Applicant: KOREA INSTITUTE OF INDUSTRIAL TECHNOLOGY, Cheonan-si, Chungcheongnam-do (KR)

(72) Inventor: Young Sik Song, Incheon (KR)

(73) Assignee: KOREA INSTITUTE OF INDUSTRIAL TECHNOLOGY, Chungcheongnam-Do (KR)

( * ) Notice: Subject to any disclaimer, the term of this patent is extended or adjusted under 35 U.S.C. 154(b) by 119 days.

(21) Appl. No.: 14/431,645

(22) PCT Filed: Sep. 26, 2013

(86) PCT No.: PCT/KR2013/008634
§ 371 (c)(1),
(2) Date: Mar. 26, 2015

(87) PCT Pub. No.: WO2014/051355
PCT Pub. Date: Apr. 3, 2014

(65) Prior Publication Data
US 2015/0259778 A1    Sep. 17, 2015

(30) Foreign Application Priority Data
Sep. 27, 2012    (KR) .................. 10-2012-0107946

(51) Int. Cl.
B32B 3/02    (2006.01)
C23C 14/04    (2006.01)
(Continued)

(52) U.S. Cl.
CPC .............. *C23C 14/04* (2013.01); *C23C 14/08* (2013.01); *C23C 14/12* (2013.01); *C23C 14/165* (2013.01);
(Continued)

(58) Field of Classification Search
CPC ......... C23C 14/08; C23C 14/22; C23C 14/34; C23C 14/048; C23C 14/541; C23C 14/12; C23C 14/54; C23C 14/3492
See application file for complete search history.

(56) References Cited

U.S. PATENT DOCUMENTS 5,894,058 A * 4/1999 Hatakeyama ............ G03F 1/14
257/E21.034
7,842,605 B1   11/2010 Pradhan et al. .............. 438/627
(Continued)

FOREIGN PATENT DOCUMENTS

JP    2005-254637 A    9/2005

OTHER PUBLICATIONS

Yu-Sen Yang et al., Mechanical and hydrophobic properties of chromium carbide films via a multi-objective optimization approach, Jan. 13, 2011, pp. 4899-4905.
(Continued)

*Primary Examiner* — Elizabeth Mulvaney
(74) *Attorney, Agent, or Firm* — Stein IP, LLC (57) ABSTRACT

This invention relates to a method of forming a fine pattern, and more particularly, to a method of forming a fine pattern using only sputtering, which enables the fine pattern to be simply formed at low cost, thus exhibiting superior productivity and economic benefits.

13 Claims, 4 Drawing Sheets

(51) Int. Cl.
  *C23C 14/34*    (2006.01)
  *C23C 14/08*    (2006.01)
  *C23C 14/12*    (2006.01)
  *C23C 14/16*    (2006.01)
  *C23C 14/18*    (2006.01)

(52) U.S. Cl.
  CPC .......... *C23C 14/185* (2013.01); *C23C 14/345* (2013.01); *Y10T 428/24612* (2015.01)

(56) References Cited

U.S. PATENT DOCUMENTS

2002/0189938 A1* 12/2002 Baldwin ................ C23C 14/46
                       204/298.03
2011/0209986 A1* 9/2011 Kitada .................. B82Y 25/00
                       204/192.15

OTHER PUBLICATIONS

Sushant K Rawal et al., Structural, Wettability and Optical Investigation of Titanium Oxynitride Coatings: Effect of Various Sputtering Parameters, Feb. 6, 2012, pp. 512-523.
Hans Hofsass et al., Surfactant sputtering, May 2008, pp. 517-524.
International Search Report issued Nov. 22, 2013, to the corresponding International Application No. PCT/KR2013/008634.
Hwan-Soo Lee, "Control of resputtering in biased CoCrPt-$SiO_2$ media to enhance grain decoupling and grain size distribution", Mar. 18, 2008, pp. 07F541-07F541.
Extended European Search Report dated Apr. 18, 2016, issued by the European Patent Office in corresponding application EP 13841594.8.

* cited by examiner

METHOD FOR FORMING FINE PATTERN, AND FINE PATTERN FORMED USING SAME

CROSS-REFERENCE TO RELATED APPLICATIONS

This application is a national stage of International Application No. PCT/KR2013/008634, filed Sep. 26, 2013, which claims the benefit of Korean Application No. 10-2012-0107946, filed Sep. 27, 2012, in the Korean Intellectual Property Office. All disclosures of the documents named above are incorporated herein by reference.

BACKGROUND OF THE INVENTION

1. Field of the Invention

The present invention relates to a method of forming a fine pattern, and more particularly, to a method of forming a fine pattern via sputtering under control of process conditions, and to a fine pattern formed thereby.

2. Description of the Related Art

In a variety of industrial fields including light emitting devices such as LED, solar cells, etc., properties required of parts are surely obtained by forming a fine pattern on a substrate. In carbon nanotubes or graphene, research into the synthesis of materials using a fine pattern is ongoing. Hence, a pattern formation process is regarded as essential. Moreover, these days in bio devices or bio technology, the formation of nano patterns and commercialization using the same are receiving attention as key areas of interest and are considered to be the core of new technological developments in the future.

For general patterning, photolithography is mainly utilized to form a desired pattern in such a manner that a photoresist is thinly applied, a mask pattern is placed thereon, light is applied and then etching is performed to thus remove unnecessary portions. However, since this photolithography process involves multiple steps of fabrication of a photomask, application of the photoresist, setting of the unnecessary portions by the mask, removal of the unnecessary photoresist via development, and etching, there are drawbacks in which process equipment or costs required therefor are significant.

In addition to the photolithography, patterning may be carried out by forming a coating layer and then performing mechanical processing or irradiation with X-ray or e-beam. However, this process requires expensive equipment, undesirably resulting in very high processing costs.

SUMMARY OF THE INVENTION

Technical Problem

Culminating in the present invention, intensive and thorough research carried out by the present inventors aiming to solve the problems encountered in the related art, led to development of techniques for forming a fine pattern, without the use of photolithography involving multiple steps or laser processing requiring expensive equipment.

Accordingly, an object of the present invention is to provide a method of forming a fine pattern using sputtering and a fine pattern formed thereby, wherein process conditions are controlled upon sputtering, and thereby a fine pattern may be formed simply at low cost using only sputtering, without the use of photolithography involving multiple steps or laser processing requiring expensive equipment to form a pattern.

Technical Solution

In order to accomplish the above objects, the present invention provides a method of forming a fine pattern using sputtering, comprising: preparing a substrate; and sputtering a target material on the substrate, thus forming a pattern, wherein upon sputtering, at least one process condition of a power condition in which a portion of the target material collides with a pre-deposited target material on the substrate to allow the pre-deposited target material to be separated from the substrate and a bias condition in which an inert gas in a chamber collides with the substrate to allow the pre-deposited target material to be separated from the substrate is controlled, so that the fine pattern is formed on the substrate.

In a preferred embodiment, the substrate comprises at least one selected from the group consisting of silicon, glass, a metal and ceramic.

In a preferred embodiment, the target material comprises at least one selected from the group consisting of an oxide, a metal and a polymer.

In a preferred embodiment, the process condition further comprises a temperature condition for heating the substrate to 50° C. or more.

In a preferred embodiment, the temperature condition has a heating temperature of 100~300° C. at a position spaced apart by 12 cm from the substrate when the target material is a polymer.

In a preferred embodiment, when the target material is a polymer, the power condition has a power of 3.46~14.81 W/cm$^2$.

In a preferred embodiment, when the target material is a polymer, the bias condition has a bias of 0.11~0.76 W/cm$^2$.

In a preferred embodiment, when the target material is a polymer, a distance between the substrate and a target upon sputtering is 3~7 cm.

In a preferred embodiment, when the target material is a polymer, a pressure in the chamber upon sputtering is 1~7 mTorr.

In a preferred embodiment, the method further comprises forming a water-repellent coating layer on the substrate, before or after forming the pattern.

In addition, the present invention provides a fine pattern formed by the method as above.

In a preferred embodiment, at least one of shape and array interval of individual elements of the fine pattern is different.

Advantageous Effects

According to the present invention, a method of forming a fine pattern enables the simple formation of a fine pattern at low cost, thus exhibiting superior productivity and economic benefits.

Also, the present invention can provide a fine pattern that is atypical but is similar to a regular pattern.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

The terms used in the present invention are possibly selected from among currently well-known terms while taking into consideration functions in the present invention, but may vary depending on the cases or intentions of those skilled in the art or on the advent of new technology. Furthermore, some of the terms mentioned in the description of the present invention have been selected by the applicant, the detailed meanings of which should be understood not simply by the actual terms used but by the meaning of each term in the detailed description of the invention or in consideration of the meanings used.

Hereinafter, a detailed description will be given of the technical construction of the present invention with reference to the appended drawings and the preferred embodiments.

However, the present invention is not limited to such embodiments and may be modified variously in many different forms. Throughout the specification, the same reference numerals are used to designate the same elements.

Unlike formation of a uniform coating layer on a substrate using sputtering, the present invention is technically characterized in that a fine pattern is formed by controlling process conditions upon sputtering. In particular, at least one of power and bias conditions is controlled in the present invention.

According to the present invention, a method of forming a fine pattern using sputtering comprises: preparing a substrate; and sputtering a target material on the substrate to form a pattern, wherein at least one of a power condition and a bias condition is controlled in a predetermined range upon sputtering, thus forming the fine pattern on the substrate.

Upon sputtering, the power condition is to apply power to the extent that a portion of the target material collides with a pre-deposited target material on the substrate to allow the pre-deposited target material to be separated from the substrate. Hence, the power condition may be differently controlled depending on the kind of target material. Also, the bias condition is to apply bias such that an inert gas in a chamber where the substrate is located collides with the substrate to allow the pre-deposited target material to be separated from the substrate. Hence, the bias condition may be differently controlled depending on the kind of target material.

As necessary, a temperature condition may be further controlled upon sputtering. Specifically, when the temperature is raised, a coating layer deposited on the surface of the substrate may be softened or reaction activation energy may increase, and thus the etching effect of the coating layer may be enhanced even upon collision of target material particles at the same energy, thereby facilitating the formation of a fine pattern. For control of the temperature condition upon sputtering, the substrate on which the target material is deposited may be heated to 50° C. or more. As such, the temperature condition, especially the maximum heating temperature, may vary depending on the kind of target material. Herein, the maximum heating temperature indicates a temperature at which the target material may not be easily applied due to excessive softening of a coating layer having the target material deposited thereon.

In the present invention, at least one of power, bias and temperature conditions may be controlled upon sputtering, and thereby the size of the resulting fine pattern or the pattern interval may be adjusted.

Useful in the method of forming the fine pattern according to the present invention, the substrate may include all materials generally used in the art. For example, at least one selected from the group consisting of silicon, glass, a metal and ceramic may be employed, and any material may be selectively utilized depending on the application fields and desired properties.

Also, the target material, which is applied on the substrate to form a fine pattern, may include all materials generally used in the art. For example, useful is at least one selected from the group consisting of an oxide, a metal and a polymer including Teflon.

Figure 1:
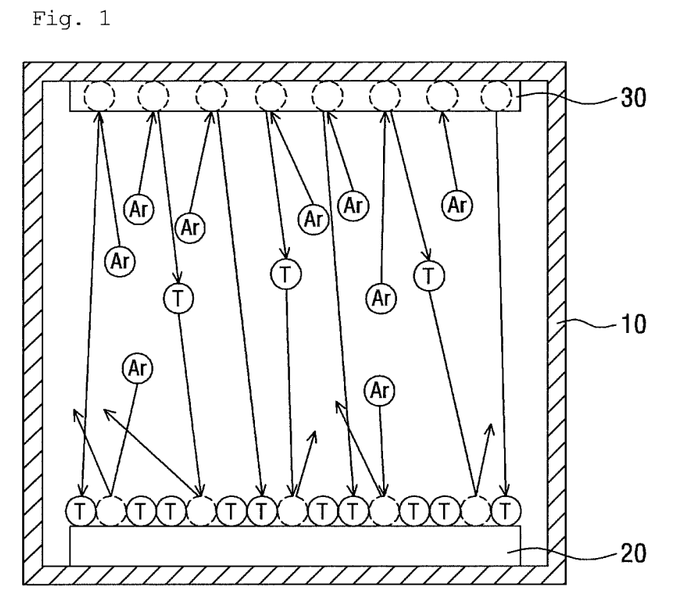
FIG. 1 schematically illustrates formation of a fine pattern according to embodiments of the present invention.

FIG. 1 schematically illustrates the formation of a fine pattern according to embodiments of the present invention. Upon general sputtering, a substrate 20 and a target 30 are provided in a chamber 10, and power and bias are applied to the substrate 20 and the target 30, whereby an inert gas such as argon (Ar) in the chamber 10 may collide with the target, so that a target material (T) is separated from the target 30, and the separated target material (T) is deposited on the substrate 20. As illustrated in FIG. 1, however, when the applied power is high, a portion of the target material (T) collides with a pre-deposited target material (T) on the substrate to allow the deposited target material (T) to be separated from the substrate, or is not deposited on the surface of the substrate 20 but may bounce out due to its originally high collision energy. Furthermore, when high bias is applied, Ar gas collides with the substrate 20 and thus causes the deposited target material (T) to be separated from the substrate. Briefly, the same effect as etching upon photolithography may be exhibited. Ultimately, the fine pattern according to the present invention may be simply formed at low cost by applying high power or bias. As used herein, the term "fine pattern" refers to a nano-sized or micro-sized pattern.

When any one condition of power and bias is applied at a low level, the other condition is applied to be higher, and thereby a desired fine pattern may be formed.

In the present invention, process conditions are controlled, without the use of existing pattern formation processes including photolithography, mechanical processing, irradiation with X-ray or e-beam, etc., thereby making it possible to simply form the fine pattern at low cost using only sputtering, resulting in superior productivity and economic benefits.

As used herein, the term "fine pattern" refers to an atypical or random pattern in which at least one of shape and array interval of individual elements of the pattern is different but the individual elements appear to be overall similar to a regular pattern, rather than a pattern in which individual elements are completely regularly arranged and have a predetermined shape.

In the present invention, the atypical fine pattern is similar to a regular pattern, and also may have advantages that cannot be ensured in a completely regular pattern. This is because the aforementioned process factors are controlled, and thus the fine pattern according to the present invention having an atypical shape may be designed so as to be adapted for desired purposes and end-uses in such a manner that the pattern of the invention may be formed as it is or may be formed to be very similar to a regular pattern. As the process conditions are controlled upon sputtering, a pattern having a large pattern interval and an irregular shape (hereinafter, referred to as a "coarse pattern"), or a pattern having a dense pattern interval and a more regular shape (hereinafter, referred to as a "dense pattern") may be obtained. Alternatively, a structure in which the above patterns are mixed (hereinafter, referred to as a "mixed pattern") may be provided. Since such patterns have different contact angles, they may be employed in processing of a fine pattern for use in electronic devices or bio devices, and especially may be applied to the control of extreme properties including ultra water repellency or ultra hydrophilicity.

Meanwhile, in the present invention, when the same target material is used, power and/or bias may be applied at a high level compared to general sputtering process conditions. In particular, when a polymer such as Teflon is used as the target material, power is set to 3.46~14.81 W/cm$^2$, and bias is set to 0.11~0.76 W/cm$^2$. Preferably, power falls in the range of 4.94~14.81 W/cm$^2$ and more preferably 4.94~9.87 W/cm$^2$. Also, bias is preferably in the range of 0.15~0.76 W/cm$^2$ and more preferably 0.15~0.38 W/cm$^2$.

When the target material is a polymer such as Teflon as in the following examples, upon sputtering, the power condition may be 3.46~14.81 W/cm$^2$, the bias condition may be 0.11~0.76 W/cm$^2$, and the temperature condition may be 50~300° C. (which is the heating temperature at a position spaced apart by 12 cm from the substrate).

Specifically, to form a fine pattern on the substrate using Teflon as the target material, power applied to the target preferably falls in the range of 3.46~14.81 W/cm$^2$, and bias applied to the substrate is preferably in the range of 0.11~0.76 W/cm$^2$. If the power is less than 3.46 W/cm$^2$ or the bias is less than 0.11 W/cm$^2$, when the target material is sputtered on the substrate, energy applied to the target material is low, and thus the target material may be uniformly applied on the substrate as in a general sputtering process, making it difficult to form the pattern.

In contrast, if the power exceeds 14.81 W/cm$^2$ or the bias exceeds 0.76 W/cm$^2$, energy of the target material is too high, and thus deposition may not be easily carried out on the substrate, making it impossible to form the pattern.

According to the present invention, a fine pattern may be formed under control of the temperature, without applying the bias. More specifically, the power applied to the target is set to 3.46~14.81 W/cm$^2$, and simultaneously, heating is performed so that the temperature is in the range of 50~300° C. If the temperature is lower than 50° C., the coating layer may not be effectively softened, making it difficult to form the fine pattern. In contrast, if the temperature is higher than 300° C., the coating process with the target material may not be easy due to excessive softening of the coating layer. Hence, the temperature is preferably set to the range of 50~300° C., and more preferably 100~300° C. for energy enhancement effects. Much more preferably, the temperature is set to 150~250° C. taking into consideration the target material weak to high temperature, such as a polymer.

In the present invention, heating for controlling the temperature condition may be conducted at a position by a predetermined distance from the substrate due to the nature of an apparatus for use in the method of the invention, and this distance may vary as necessary or may be set differently depending on the kind of apparatus. In the following examples, heating was performed at a position spaced apart by about 12 cm from the substrate. Furthermore, heating may be conducted at a position shorter or longer from the substrate, or may be implemented directly under the substrate. In this case, heating may be carried out in the temperature range different from the heating temperature range disclosed in the examples of the present invention based on 12 cm, which may be incorporated in the scope of the present invention. Even when the substrate is heated in the corresponding temperature range, the temperature near the substrate is much lower than the heating temperature due to almost vacuum-like atmosphere in the chamber. Furthermore, the temperature near the substrate may become similar to the temperature level increasing in proportion to application of the power or bias.

Upon sputtering for forming a fine pattern as disclosed in the following examples, a distance between the substrate and the target is preferably set to 3~7 cm. If the distance is less than 3 cm, excessive energy is supplied to the target material due to the very short distance between the substrate and the target, making it difficult to form the fine pattern. In contrast, if the distance is greater than 7 cm, too low energy is applied to the target material and thus the pattern cannot be formed. More preferably, the distance between the substrate and the target is set to 4~6 cm.

Also, the pressure in the chamber where sputtering is performed in the following examples is preferably set to 1~7 mTorr under general experimental conditions. The pressure in the chamber is related to collision energy of target material particles. As the pressure approximates to high vacuum, interference between the target material particles colliding with the substrate may decrease in terms of mean free path, and thus collision energy of the target material particles may increase, making it easy to form the pattern. For such effects, the pressure in the chamber is preferably set to 7 mTorr or less. If the pressure in the chamber is less than 1 mTorr, an excessive vacuum atmosphere may be formed, thus making it difficult to perform sputtering. However, when specific experimental conditions are given without the use of inert gas in the chamber, instead of general experimental conditions, sputtering is possible even at a pressure in the chamber of less than 1 mTorr.

As mentioned above, the method of the invention enables the simple formation of a fine pattern at low cost. Moreover, the fine pattern of the invention may be water-repellent and may thus be effectively applied to products requiring water repellency. Furthermore, the magnitude of water repellency may be appropriately controlled by adjusting the shape of the fine pattern and by changing the kind of coating material. As used herein, the term "water repellency" refers to a contact angle with water of 100° or more.

Meanwhile, in the present invention, forming a water-repellent coating layer may be further carried out either or both of before and after forming the fine pattern, thereby further enhancing water repellency. A general water-repellent coating layer has a contact angle of about 110°, and the fine pattern of the invention has water repellency similar to or superior to the general water-repellent coating layer. Accordingly, when the water-repellent coating layer is formed either or both of before and after forming the fine pattern, it is possible to prepare a substrate having a coating layer having a contact angle of 130~150°, and thus such a substrate is preferably applied to products requiring ultra water repellency. Forming the water-repellent coating layer is not particularly limited in the present invention, and may be performed using any material or process widely known in the art.

A better understanding of the present invention may be obtained via the following examples which are set forth to illustrate, but are not to be construed as limiting the scope of the present invention.

EXAMPLES 1 to 3

A silicon substrate and a 2-inch Teflon target having a circular disk shape were prepared, and the silicone substrate was coated with the target material for 60 min using a sputtering apparatus under sputtering conditions as shown in Table 1 below. Then, Ar gas was allowed to flow in the chamber. In the following table, the distance indicates a distance between the substrate and the target, the heating temperature is a temperature applied toward the substrate at a position spaced apart by 12 cm from the substrate, and the measurement temperature is a temperature measured at a position spaced apart by 4~6 cm from the substrate. Ultimately, fine pattern-formed substrates 1 to 3 resulting from coating the substrate with the target material were obtained.

TEST EXAMPLE 1

Figure 2:
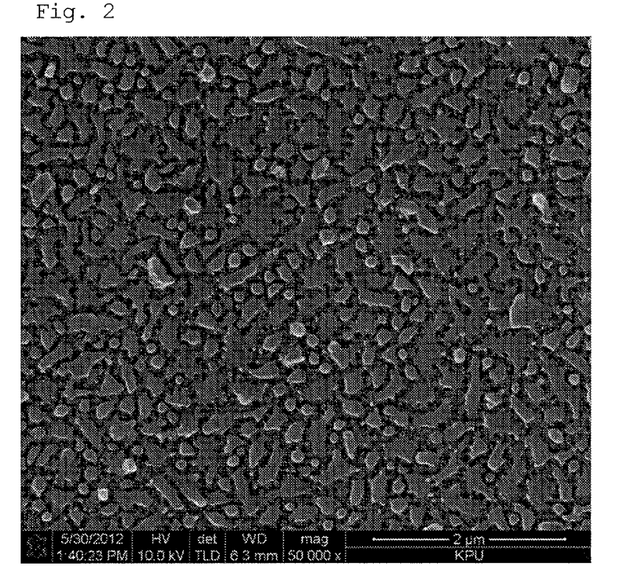
FIG. 2 illustrates a surface image of a substrate having a mixed pattern according to an embodiment of the present invention.
Figure 3:
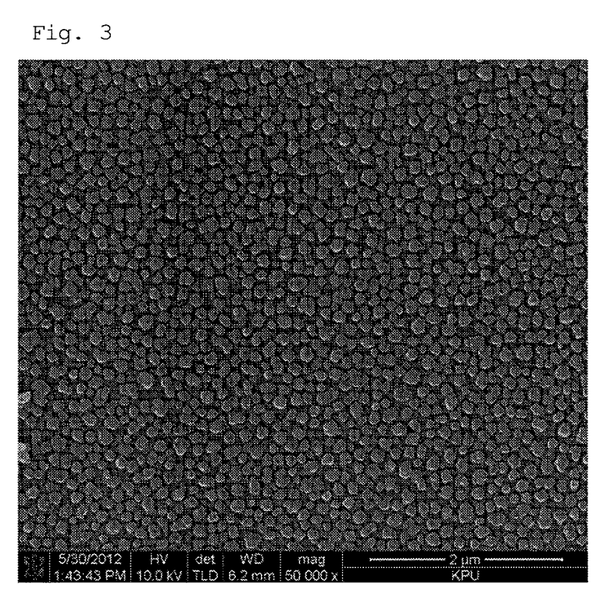
FIG. 3 illustrates a surface image of a substrate having a dense pattern according to another embodiment of the present invention.
Figure 4:
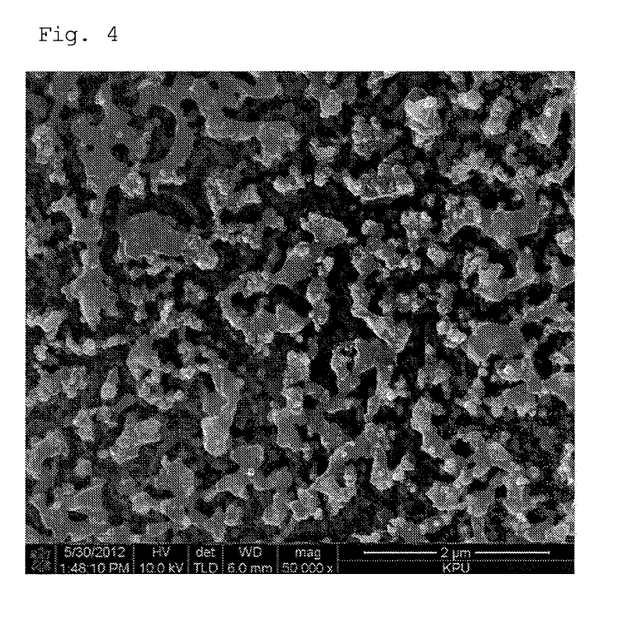
FIG. 4 illustrates a surface image of a substrate having a coarse pattern according to still another embodiment of the present invention.
Figure 5:
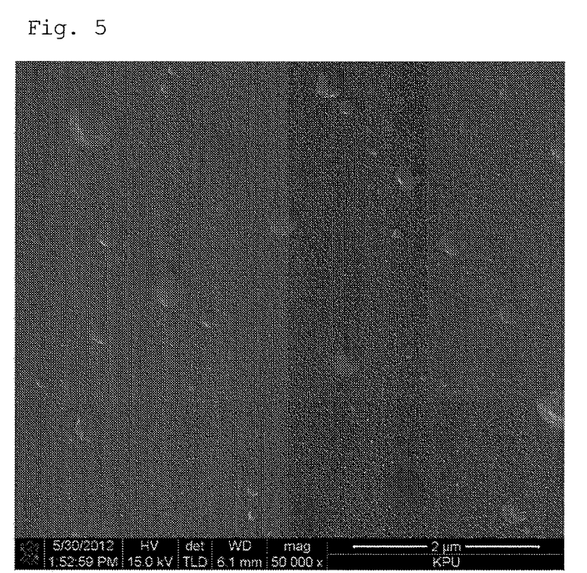
FIG. 5 illustrates a surface image of a substrate having a coating layer with a grain structure, in lieu of a pattern, according to a comparative embodiment of the present invention.
Figure 6:
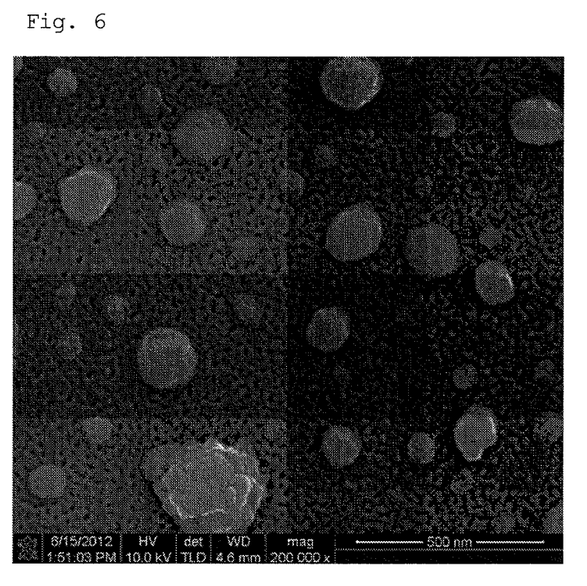
FIG. 6 illustrates a surface image of a substrate having a coating layer with a network structure, in lieu of a pattern, according to another comparative embodiment of the present invention.
Figure 7:
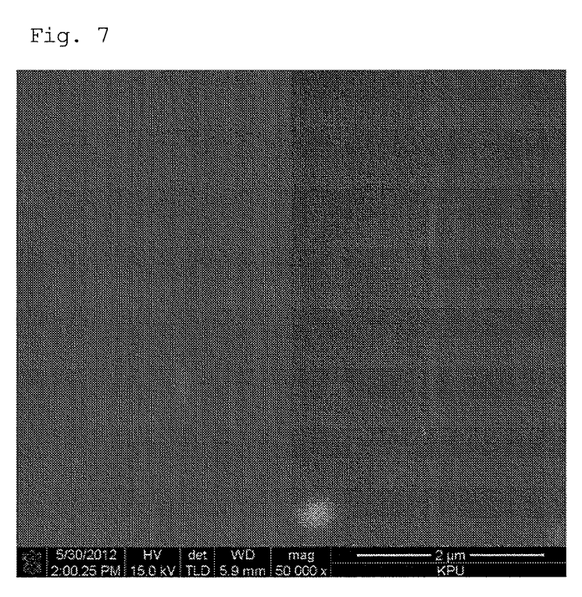
FIG. 7 illustrates a surface image of a substrate having a uniformly deposited coating layer according to still another comparative embodiment of the present invention.

The surfaces of the fine pattern-formed substrates 1 to 3 obtained in Examples 1 to 3 were observed. The results are shown in FIGS. 2 to 4. Also, the surfaces of the comparative substrates 1 to 10 obtained in Comparative Examples 1 to 10 were observed. The results are shown in FIGS. 5 to 7.

As shown in FIGS. 2 to 4, the fine pattern-formed substrates 1 to 3 obtained in Examples 1 to 3 under the sputtering conditions according to the present invention had a fine pattern.

FIG. 2 illustrates the surface of the fine pattern-formed substrate 1 obtained in Example 1. As illustrated in FIG. 2, in Example 1 where all of power, bias and heating among the process conditions according to the present invention were applied appropriately, a mixed pattern including a large atypical pattern and a small circular-like pattern, which are combined properly, was formed.

FIG. 3 illustrates the surface of the fine pattern-formed substrate 2 obtained in Example 2. As illustrated in FIG. 3, in Example 2 where power and heating among the process conditions according to the present invention were applied appropriately, a dense pattern having a circular-like shape and a narrow pattern interval was formed.

FIG. 4 illustrates the surface of the fine pattern-formed substrate 3 obtained in Example 3. As illustrated in FIG. 4, in Example 3 where power and bias among the process conditions according to the present invention were applied appropriately, an atypical coarse pattern, the shape of which is not relatively specific but overall shows a predetermined pattern, was formed compared to Example 2. The pattern interval can also be seen to be large.

On the other hand, in Comparative Examples 1 to 10 in which sputtering was performed under conditions that do not

TABLE 1

| Class. | Power (W/cm$^2$) | Bias (W/cm$^2$) | Distance (cm) | Pressure in chamber (mTorr) | Gas flow rate (SCCM) | Heating temp. (° C.) | Measurement temp. (° C.) |
|---|---|---|---|---|---|---|---|
| Ex. 1 | 7.40 | 0.19 | 5 | 2.5 | 10 | 300 | 70.3 |
| Ex. 2 | 7.40 | 0 | 5 | 5 | 5 | 300 | 56.7 |
| Ex. 3 | 7.40 | 0.19 | 5 | 5 | 5 | — | 60.2 |

COMPARATIVE EXAMPLES 1 to 10

Comparative substrates 1 to 10 were obtained in the same manner as in Example 1, with the exception that sputtering conditions as shown in Table 2 below were applied.

satisfy the process conditions according to the present invention, a coating layer having an irregular grain structure or network structure or a uniform coating layer as in general sputtering was formed, rather than the fine pattern of Examples 1 to 3 according to the present invention.

TABLE 2

| Class. | Power (W/cm$^2$) | Bias (W/cm$^2$) | Distance (cm) | Pressure in chamber (mTorr) | Gas flow rate (SCCM) | Heating temp. (° C.) | Measurement temp. (° C.) |
|---|---|---|---|---|---|---|---|
| C. Ex. 1 | 2.47 | 0 | 5 | 2.5 | 5 | — | 28.6 |
| C. Ex. 2 | 2.47 | 0.19 | 5 | 2.5 | 5 | 300 | 70.2 |
| C. Ex. 3 | 2.47 | 0.19 | 7 | 5 | 5 | 300 | 66.2 |
| C. Ex. 4 | 2.47 | 0 | 7 | 5 | 5 | — | 29.2 |
| C. Ex. 5 | 2.47 | 0.19 | 5 | 5 | 10 | — | 46.3 |
| C. Ex. 6 | 7.40 | 0 | 5 | 2.5 | 10 | — | 40.4 |
| C. Ex. 7 | 2.47 | 0 | 7 | 2.5 | 10 | 300 | 50.5 |
| C. Ex. 8 | 7.40 | 0 | 7 | 5 | 10 | — | 40.2 |
| C. Ex. 9 | 2.47 | 0 | 5 | 5 | 10 | 300 | 45.3 |
| C. Ex. 10 | 2.47 | 0.19 | 7 | 2.5 | 10 | — | 46.8 |

FIG. 5 illustrates the surface of the comparative substrate 1 obtained in Comparative Example 1. As illustrated in FIG. 5, in Comparative Example 1 where power was applied to be lower than the power range according to the present invention and bias and heating were not applied, the resulting coating layer was configured such that small grains were distributed and large grains were very irregularly formed on a certain portion.

Although not shown, in Comparative Example 2 where power was applied to be lower than the power range according to the present invention and bias and heating were applied, and in Comparative Example 5 where power was applied to be lower than the power range according to the present invention and only bias was applied, almost the same coating layer as in Comparative Example 1 was obtained.

FIG. 6 illustrates the surface of the comparative substrate 4 obtained in Comparative Example 4. As illustrated in FIG. 6, in Comparative Example 4 where power was applied to be lower than the power range according to the present invention and bias and heating were not applied and in which the distance between the substrate and the target was longer than in Comparative Example 1, the resulting coating layer was configured such that comparatively large grains were very irregularly formed and supported by a matrix having a network structure.

FIG. 7 illustrates the surface of the comparative substrate 6 obtained in Comparative Example 6. As illustrated in FIG. 7, in Comparative Example 6 where power was applied so as to satisfy the power condition according to the present invention but bias and heating were not applied, a uniform coating layer as in general sputtering was formed.

Although not shown, in Comparative Examples 3, 7 and 10 where bias and heating were applied so as to satisfy the conditions according to the present invention but power was applied at a lower level, the resulting comparative substrates 3, 7 and 10 had no fine pattern and had a uniform coating layer as in general sputtering. Also, in Comparative Example 8 where power was applied so as to satisfy the power condition according to the present invention but bias and heating were not applied, a uniform coating layer as in general sputtering was formed, like Comparative Example 6.

TEST EXAMPLE 2

The water contact angle of the fine pattern-formed substrates 1 to 3 obtained in Examples 1 to 3 was measured. The results are shown in Table 3 below.

TABLE 3

| Class. | Contact angle (°) |
|---|---|
| Ex. 1 | 116 |
| Ex. 2 | 109 |
| Ex. 3 | 106 |

As is apparent from Table 3, the fine pattern-formed substrate 1 obtained in Example 1 had a contact angle as large as 116°, and thus exhibited superior water repellency. Further, since the fine pattern-formed substrate 2 obtained in Example 2 had a contact angle of 109°, superior water repellency was obtained. Furthermore, the fine pattern-formed substrate 3 obtained in Example 3 had a contact angle of 106°, resulting in superior water repellency.

Although the preferred embodiments of the present invention have been disclosed for illustrative purposes, those skilled in the art will appreciate that various modifications and substitutions are possible, without departing from the scope and spirit of the invention as disclosed in the accompanying claims.

The invention claimed is:

1. A method of forming a fine pattern using sputtering, comprising:
    preparing a substrate; and
    sputtering a target material on the substrate, thus forming a pattern,
    wherein upon sputtering, at least one process condition of a power condition in which a portion of the target material collides with a pre-deposited target material on the substrate to allow the pre-deposited target material to be separated from the substrate and a bias condition in which an inert gas in a chamber collides with the substrate to allow the pre-deposited target material to be separated from the substrate is controlled, so that the fine pattern is formed on the substrate, and
    wherein the process condition further comprises a temperature condition for heating the substrate to 50° C. or more.

2. The method of claim 1, wherein the substrate comprises at least one selected from the group consisting of silicon, glass, a metal and ceramic.

3. The method of claim 1, wherein the target material comprises at least one selected from the group consisting of an oxide, a metal and a polymer.

4. The method of claim 1, wherein the temperature condition has a heating temperature of 100~300° C. at a position spaced apart by 12 cm from the substrate when the target material is a polymer.

5. The method of claim 1, wherein when the target material is a polymer, the power condition has a power of 3.46~14.81 W/cm$^2$.

6. The method of claim 1, wherein when the target material is a polymer, the bias condition has a bias of 0.11~0.76 W/cm$^2$.

7. The method of claim 1, wherein when the target material is a polymer, a distance between the substrate and a target upon sputtering is 3~7 cm.

8. The method of claim 1, wherein when the target material is a polymer, a pressure in the chamber upon sputtering is 1~7 mTorr.

9. The method of claim 1, further comprising forming a water-repellent coating layer on the substrate, before or after forming the pattern.

10. A fine pattern formed by the method of claim 1.

11. The fine pattern of claim 10, wherein at least one of shape and array interval of individual elements of the fine pattern is different.

12. A fine pattern formed by the method of claim 5.

13. The fine pattern of claim 5, wherein at least one of shape and array interval of individual elements of the fine pattern is different.

* * * * *